(12) United States Patent
Mahoney

(10) Patent No.: US 8,378,671 B1
(45) Date of Patent: Feb. 19, 2013

(54) DEPLOYABLE MAGNETOMETER

(75) Inventor: Morgan Mahoney, Panama City, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 393 days.

(21) Appl. No.: 12/801,028

(22) Filed: May 18, 2010

(51) Int. Cl.
*G01R 33/02* (2006.01)
(52) U.S. Cl. ........ 324/248; 324/365; 324/345; 324/348; 324/350; 367/15; 367/16
(58) Field of Classification Search .................. 324/248, 324/244, 260, 301, 350, 365, 348, 345; 367/15, 367/16
See application file for complete search history.

(56) References Cited

U.S. PATENT DOCUMENTS

| | | | | |
|---|---|---|---|---|
| 4,664,559 A * | 5/1987 | Berrang | ........................ | 405/224 |
| 5,741,167 A * | 4/1998 | Hagerty | ........................ | 441/13 |
| 6,031,377 A * | 2/2000 | Watkins | ........................ | 324/345 |
| 6,558,216 B2 * | 5/2003 | Yerazunis et al. | ............... | 441/11 |
| 6,976,445 B1 * | 12/2005 | Arneson | ........................ | 114/315 |
| 7,116,108 B2 * | 10/2006 | Constable | ........................ | 324/350 |
| 8,253,418 B2 * | 8/2012 | Constable et al. | ............. | 324/365 |
| 2009/0141591 A1 * | 6/2009 | Basilico | ........................ | 367/128 |
| 2010/0271032 A1 * | 10/2010 | Helwig | ........................ | 324/365 |
| 2010/0321024 A1 * | 12/2010 | Nichols et al. | ................ | 324/348 |
| 2012/0161774 A1 * | 6/2012 | Strack et al. | .................. | 324/332 |

* cited by examiner

*Primary Examiner* — Huy Q Phan
*Assistant Examiner* — Thang Le
(74) *Attorney, Agent, or Firm* — James T. Shepherd

(57) ABSTRACT

Cost-effective compact magnetometers can be deployed across large ocean areas to record magnetic field strengths. Each magnetometer has a canister containing a magnetometer sensor at its upper end to detect magnetic field strengths of magnetic influence sweep systems and provide representative data signals. Each magnetometer also has sensors to collect data representative of the orientation of the magnetometer as well as temperature and depth to aid in post operational evaluation of the gathered magnetic strength data. A computer processor connected to the sensors controls receipt of the data signals and stores them in a memory device. Batteries at the canister's lower end supply power for the sensors, processor, and memory. An anchor release mechanism causes an anchor to separate from the canister, allowing it to float to the surface for recovery or to transmit data via a UHF transceiver.

6 Claims, 3 Drawing Sheets

FIG. 3
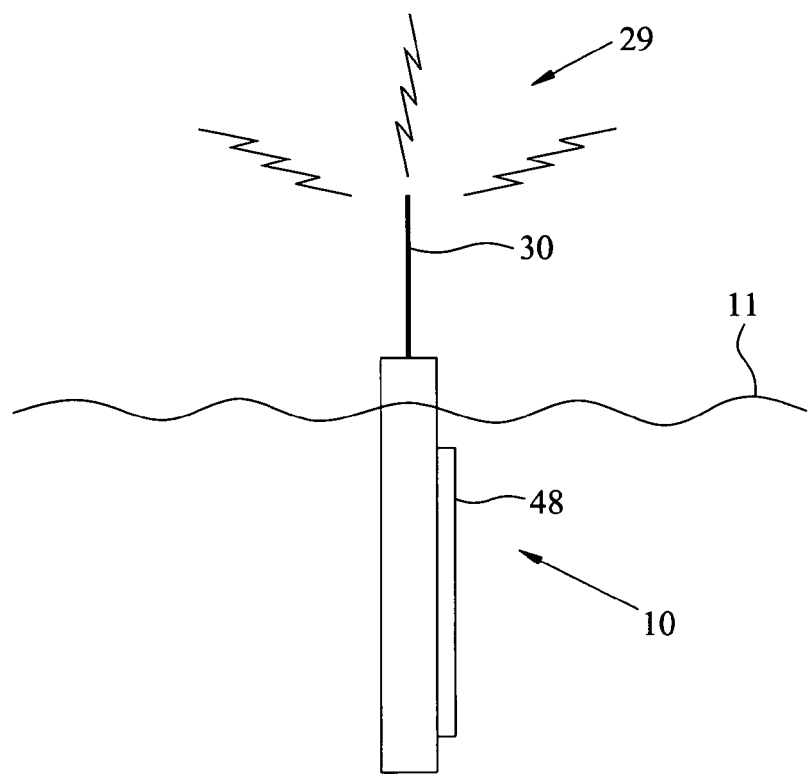
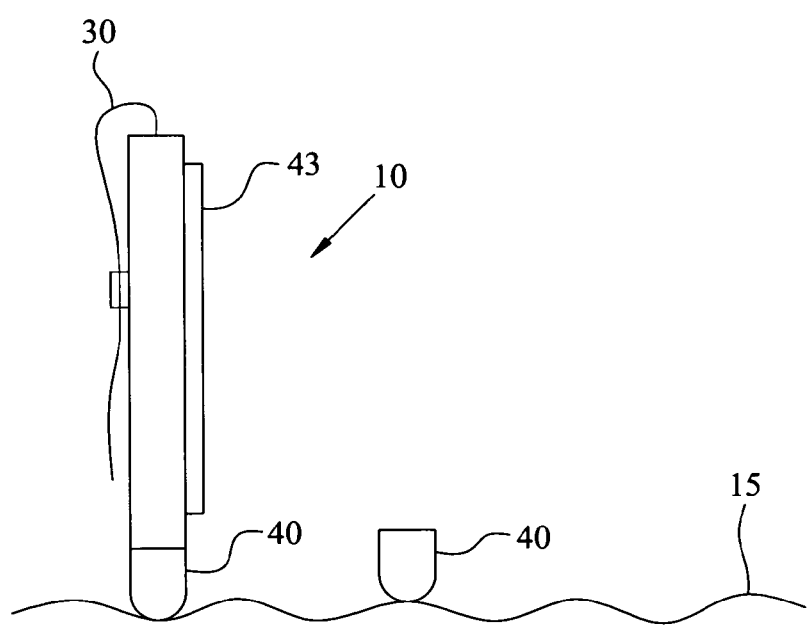

DEPLOYABLE MAGNETOMETER

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION

This invention relates to a system for recording magnetic field strengths in the marine environment. More particularly, the invention is for a magnetometer for recording real-time magnetic field strengths to allow a determination of the effectiveness of minesweeping operations in different water environments.

Magnetic minesweeping operations are performed in a wide variety of ocean environments that exhibit differing characteristics that can affect the performance of the sweep systems. Predictions of sweep performance are historically based on limited knowledge of the water and bottom conditions and structure. Effective minesweeping operations require that areas be swept of mines to a high or total level of clearance with an associated level of confidence. Inaccurate predictions of the area's magnetic environment can lead to sweep operations that fall short of the needed clearance levels.

Thus, in accordance with this inventive concept, a need has been recognized in the state of the art for a magnetometer packaged in a man-portable container for deployment from a vessel or aircraft to record real-time magnetic field strengths in a body of water and recover the gathered data manually or via a radio frequency link to a surface or airborne remote data retrieval platform for determining the effectiveness of minesweeping operations in various water environments.

SUMMARY OF THE INVENTION

The present invention provides a magnetometer that can be deployed individually or in patterns of many magnetometers across large expanses of the ocean to record magnetic field strengths. The magnetometer has an elongate canister made from a non-magnetic material containing a magnetometer sensor at one end. The magnetometer sensor has sensitivity and resolution to detect magnetic field strengths of magnetic influence sweep systems operated by surface or airborne platforms and provides data signals representative of the detected magnetic field strengths. A computer processor in the canister is connected to the magnetometer sensor and is appropriately pre-programmed to control recording of field strengths and transmission of detected magnetic field strength data. A memory device, such as a volatile memory, is in the canister at the computer processor and is coupled to the computer processor to store the magnetic field strength data. A power distribution system includes at least one battery in the canister at the end opposite from the magnetometer sensor and has electrical power distributing conductors to supply electrical power for the magnetometer sensor, the computer processor, the memory device, and other data generating components to be described. A combination anchor release mechanism is connected to the canister at the opposite end, and is connected to an anchor. An acoustic transducer on the outside of the canister can be connected to the power distribution system and the combination anchor release mechanism can be activated by an acoustic signal from the acoustic transducer to release the canister from the anchor. Optionally, the combination anchor release mechanism can utilize a dissolving link dissolvable in seawater after a predetermined period of time to release the canister from the anchor, or the combination anchor release mechanism has an onboard solenoid operated release controlled by the computer processor to release the canister from the anchor. An orientation sensor is provided in the canister and is coupled to the computer processor and the power distribution system. The orientation sensor senses and provides data signals representative of the heading, pitch, and roll of the magnetometer sensor and sends the heading/pitch/roll data to the memory device at the computer processor. A temperature and depth sensor in the canister is coupled to the computer processor and the power distribution system. The temperature and depth sensor senses and provides data representative of temperature and depth of the magnetometer sensor and sends the temperature and depth data to the memory device at the computer processor. The invention also has a UHF transceiver inside and at the upper end of the canister with an antenna on the outside of the canister. The UHF transceiver is coupled to the power distribution system to transmit and receive signals including collected data signals and remotely originating command signals. A magnetically operated switch is mounted on the inside of the canister and is coupled to the power distribution system. The magnetically operated switch is turned on by passing a small magnet over the external surface of the canister adjacent to the internal location of the magnetically operated switch to supply electrical power from the batteries via the electric power conductors to other components in the canister.

An object of the invention is to provide an apparatus and method to collect data that can be used to allow a determination of the effectiveness of minesweeping operations in different water environments.

Another object of the invention is to provide an apparatus and method for recording real-time magnetic field strengths for determining effectiveness of minesweeping operations in various water environments.

Another object of the invention is to provide a vessel or aircraft deployed apparatus to collect data that can be used to determine effectiveness of minesweeping operations.

Another object of the invention is to provide an apparatus and method to collect data that can be used to determine effectiveness of minesweeping operations in various water environments with a high level of confidence.

Another object of the invention is to provide naval planners a better understanding of the effectiveness of magnetic mine sweeping operations by measuring the actual magnetic sweep performance in an operational environment.

Another object of the invention is to provide an apparatus and method to collect data that can be used to determine effectiveness of minesweeping operations using portable and expendable packages that eliminate hazardous exposures of personnel in the field.

Another object of the invention is to provide a cost effective magnetometer packaged in a sonobuoy-sized container for ease in handling and launching.

Another object of the invention is to provide a cost effective apparatus using primarily off-the-shelf commercial components to collect data that can be used to determine effectiveness of minesweeping operations.

These and other objects of the invention will become more readily apparent from the ensuing specification when taken in conjunction with the appended claims.

BRIEF DESCRIPTION OF THE DRAWINGS

FIG. 3 is a schematic depiction of two magnetometers of the invention showing one resting on the bottom gathering data and the other at the surface of a body of water with its antenna transmitting gathered data to a remote data retrieval platform.

DESCRIPTION OF THE PREFERRED EMBODIMENT

Figure 1:
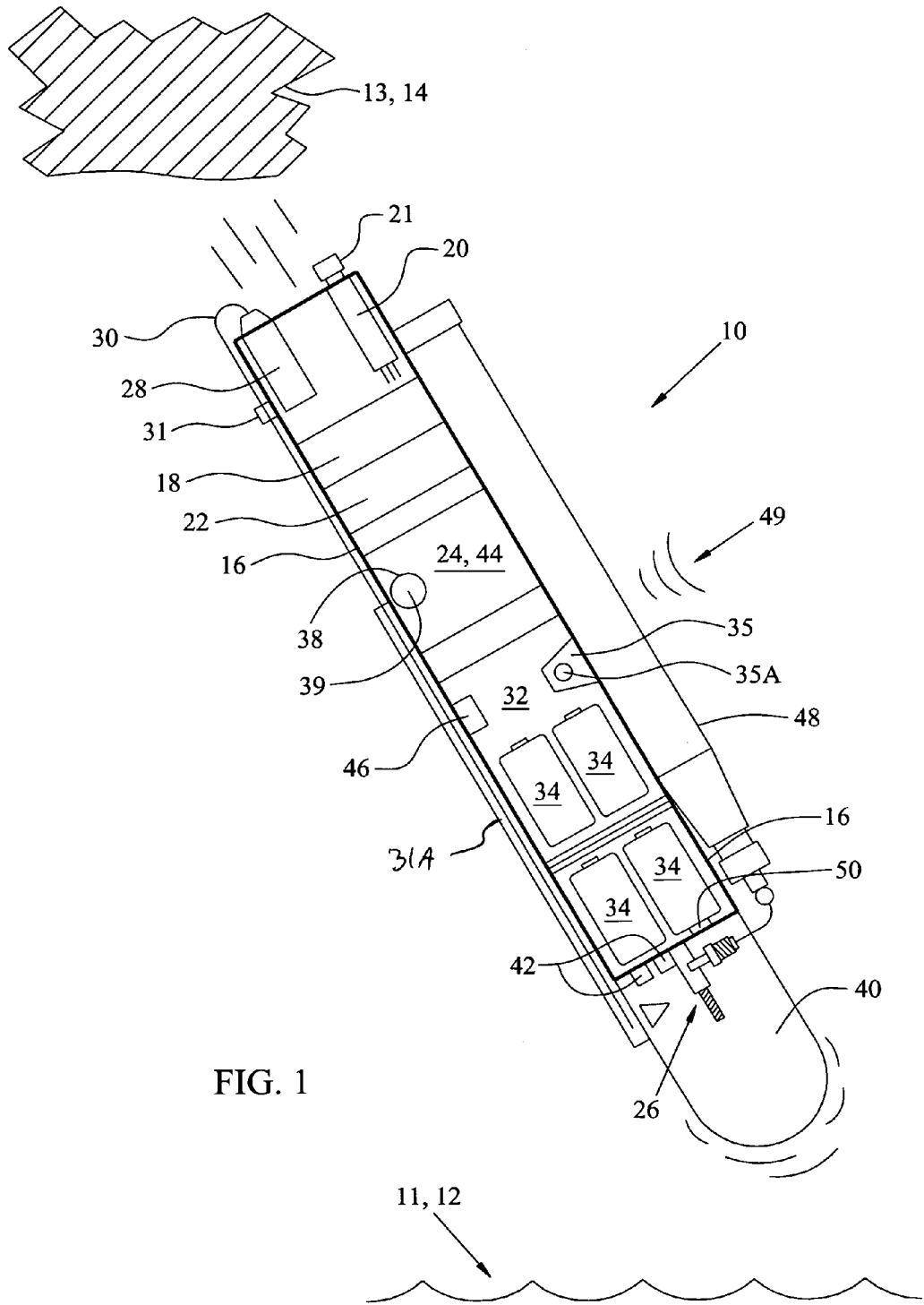
FIG. 1 is a schematic side view shown partially in cross section of the deployable in-situ magnetometer of the invention being deployed from a ship or aircraft into the ocean.

Referring to FIGS. 1 and 3, deployable magnetometer 10 of the invention is schematically depicted as it is being dropped onto the surface 11 of the ocean 12 from a surface craft 13 or aircraft 14. Deployment of one or more, or patterns of a considerable number of magnetometers 10 to rest on the bottom 15 in a given area in a body of water such as ocean 12 permits monitoring and determination of the tactical effectiveness of offensive and defensive magnetic minesweeping operations.

Magnetometer 10 is sized and weighted to be man-portable and capable of being stowed in numbers on vessels and aircraft and deployed from them in operational areas. This packaging is preferably similar in size to an A-size sonobuoy to permit easy integration into existing deployment platforms. Typically, it has can fit through cabin-access doors and passageways of MH-60 type helicopters, for example. The compact design allows magnetometer 10 to be manually recovered for retrieval of gathered data, or the data can be transmitted to a remote data retrieval platform via radio-link as described below.

Magnetometer 10 has an elongate cylindrically-shaped electronics canister 16. Canister 16 provides a protective enclosure for components of magnetometer 10, which include a magnetometer sensor 18, combination temperature-and-depth sensor 20, orientation sensor 22, data-recording computer processor 24, an anchor release mechanism 26, UHF radio transceiver 28 with antenna 30, and power distribution system 32 including electrical power distributing conductors 33 (FIG. 2) and batteries 34. Canister 16 is made from materials that are non-magnetic, e.g. plastic or composites, to minimize interference with magnetometer sensor 18 and other sensors referred to above. Canister 16 can itself pass the magnetic field strength energy that magnetometer sensor 18 senses or, in the exercise of ordinary skill, one skilled in the art to which this invention pertains can provide appropriately located suitable openings and/or windows made of suitable materials in canister 16 to assure transmission of acceptable magnitudes of the energy of the magnetic field strength.

For the purposes of this description and the ensuing claims, the terms "lower end" and "bottom" of magnetometer 10 refer to the end of the magnetometer 10 that rests on the sea floor 15 and/or contains anchor 40, as illustrated in FIGS. 1 and 3. The terms "upper end" and "top" of magnetometer 10 refer to the end opposite from the lower end.

By way of example, FIG. 1 schematically shows magnetometer sensor 18 located near or at an upper end of magnetometer 10. This location places magnetometer sensor 18 at the top as magnetometer 10 is likely to rest on and upwardly extend from bottom 15 of ocean 11 after deployment, also see magnetometer 10 at the lower left of FIG. 3. The schematic depiction of magnetometer sensor 18 and the other sensors depicted in the drawings is intended to be demonstrative of the invention and is not intended to be limiting, and accordingly, one skilled in the art can locate and/or relocate the sensors to maximize the effectiveness of magnetometer 10.

Magnetometer sensor 18 has sensitivity and resolution that are sufficient to detect the passage of magnetic field strengths of magnetic influence sweep systems operated by surface or airborne platforms at specified ranges. Magnetometer sensor 18 can be any of a number of commercially available units that are capable of sensing and reporting magnetic field strengths over three orthogonal axes. Magnetometer sensor 18 is magnetically isolated from the rest of the components of magnetometer 10 by evoking appropriate material selections, use of magnetic shielding materials, routing of cabling, and the arrangement of interior components in accordance with established practices of one skilled in the art to prevent the generation of local, spurious electro-magnetic fields.

Temperature and depth sensor 20 has a combination sensor element 21 extending through said canister 16 that senses and passes data to computer processor 24 representative of water temperature and the depth where magnetometer 10 sits on bottom 15. Temperature and depth sensor 20 coupled to computer processor 24 and power distribution system 32 senses and provides data signals representative of temperature and depth of magnetometer sensor 18 and couples the temperature and depth data signals to memory device 44 at computer processor 24 to also provide an interlock for UHF transceiver 28 to only allow RF transmission of data when the magnetometer is at the surface. Additionally, orientation sensor 22 provides data to computer processor 24 representative of the heading, roll and pitch orientations of magnetometer 10. Orientation sensors are well known and widely used in the arts associated with navigation, inertial guidance and autonomous vehicle guidance, and selection of a suitable sensor 22 for incorporation in magnetometer 10 of the invention is within the exercise of skill by one of ordinary skill in the art. Orientation data is useful for post-processing collected magnetic data from magnetometer sensor 18 to correct for movement of magnetometer 10 if it is disturbed by underwater currents or sea life, for example. In other words, sensors 20 and 22 give on-going data representative of on-going changes in depth, heading, roll and pitch which is valuable information to permit a more meaningful post-mission analysis and evaluation of magnetic sweep performance.

Figure 2:
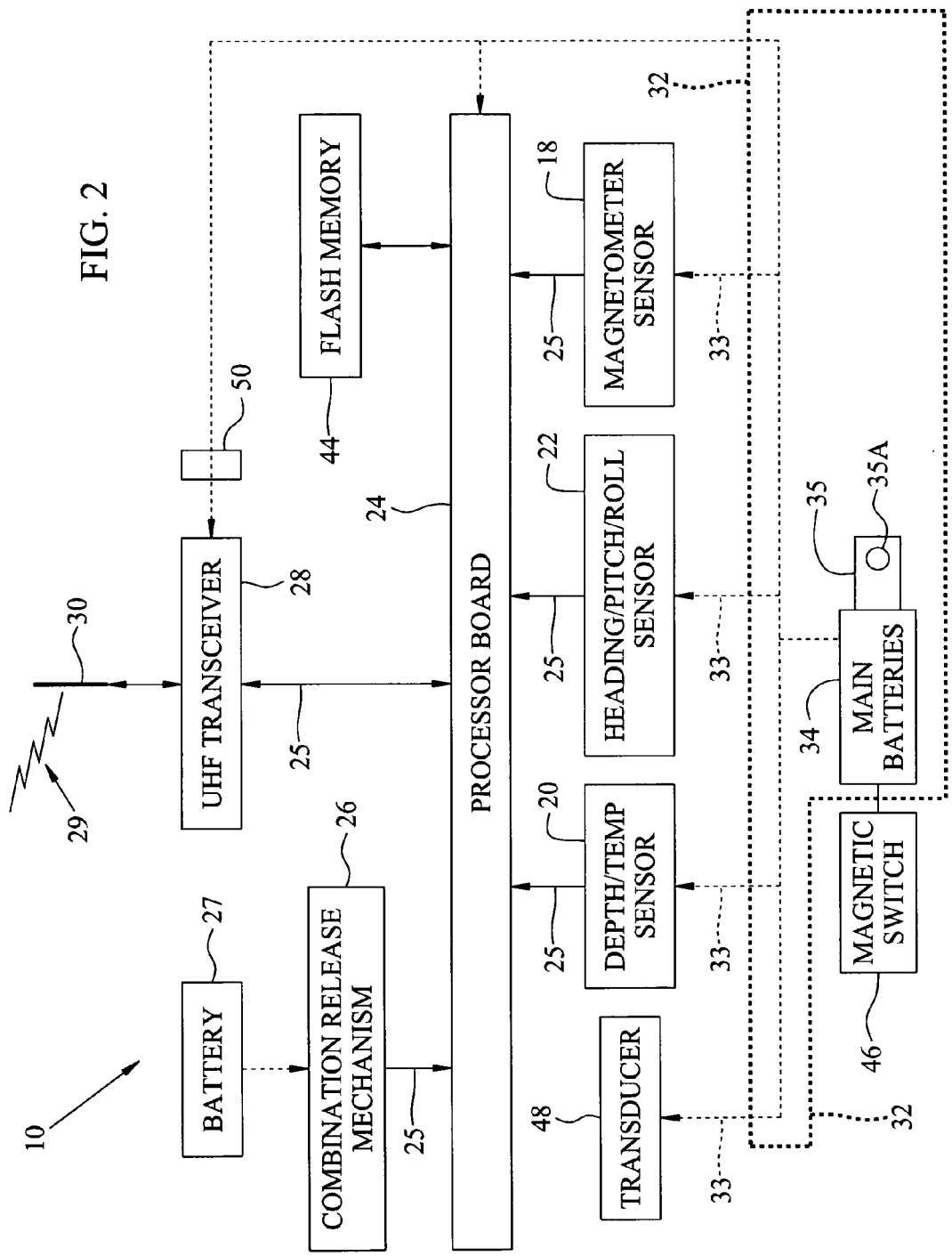
FIG. 2 is a schematic block-diagram of interconnected components of the magnetometer of the invention.

Referring to FIG. 2, magnetometer 10 is controlled through computer processor 24 that is appropriately pre-programmed and later activated to coordinate the control and receipt of sensed magnetic field strengths of magnetometer sensor 18, data from temperature-and-depth sensor 20, data from orientation sensor 22, data exchange, and data recording. Computer processor 24 has control leads 25 coupled to sensors 18, 20, 22, to release mechanism 26 and UHF transceiver 28 to control the sequence of events and data gathering based on programmed commands.

Referring again to FIG. 1, an external, waterproof communications port 38 having a removable, sealed cover 39 extends through canister 16 to allow for pre-deployment programming of computer processor 24 of magnetometer 10. This preprogramming can include setting the period(s) for selective activation of the sensors of magnetometer 10 to one or more sequences of on-and-off time, time of release of an anchor 40 by release mechanism 26 (to be described), time of scuttling magnetometer 10 using appropriately actuated plugs 42 and/or dissolving structure for plugs 42, for examples, extending through the wall of canister 16, and crypto keying of UHF transceiver 28 (if needed). Communications port 38 can also be used to download collected data from computer processor 24 following a mission when magnetometer 10 is manually recovered.

Programming data of computer processor 24 and data representative of magnetic field strengths of magnetometer sensor 18, of temperature/depth data collected by temperature/depth sensor 20, and of heading/pitch/roll data collected by orientation sensor 22, are recorded to a volatile memory device 44, e.g. flash memory, that can be a separate component properly interconnected to, or an integral part of, computer processor 24. The stored data of sensors 18, 20 and 22 in volatile memory 44 is saved at least until computer processor 24 is activated to transmit the data via UHF transceiver 28 or the data is extracted at a remote facility when the entire magnetometer 10 is manually recovered. Using a solid state memory for memory device 44 improves reliability, requires little power, and consumes little space. Additionally, this type of memory provides some security if magnetometer 10 is lost, because when power is removed (per shutdown command or battery exhaustion), stored data is erased.

A magnetically operated switch 46 is mounted on the inside of canister 16 and is coupled to power distribution system 32. Switch 46 is turned on by passing a small magnet over the external surface of canister 16 adjacent to the location where switch 46 is internally located to supply electrical power from batteries 34 via conductors 33 of power distribution system 32 to the other components referred to above. This triggers a power up sequence that prepares magnetometer 10 for operation, and following a predetermined boot up time, computer processor 24 can be connected to a topside computer via opened port 38 for programming.

Referring again to FIG. 2, power distributing system 32 has a power distribution/monitoring module 35 that controls the charging of the long endurance, rechargeable dry cell batteries 34 that are sized to accommodate the longest mission time envisioned and prepares the other electronics for shutdown if battery life is low. Module 35 of system 32 has a closable access port 35A to permit connection to an external power source for recharging batteries 34 prior to a mission.

UHF transceiver 28 can be a small UHF transceiver installed at the upper end of magnetometer 10 to transmit UHF data signals 29 following a mission when it has been properly interrogated by a remote radio. An encryption device or software in UHF transceiver 28 or in interconnected computer processor 24 can optionally be used in the transmission or receipt of radio signals to prevent the compromise of transmitted data.

Antenna 30 is spring loaded to normally extend upward and away from the top of magnetometer 10, but is folded and held adjacent to the exterior of canister 16 during stowage and launch by a radio-activated electromechanical device, such as a clamp 31 or sleeve 31A, that secures the end of the antenna to the canister 16 (note that, while both types of devices 31 and 31A are illustrated in the FIGs, it is anticipated that only one would normally be used on the magnetometer 10). When clamp 31 is used, it is activated by an appropriate signal from UHF transceiver 28 to release antenna 30, and the spring-like nature of antenna 30 causes it to extend upward and away from canister 16. Alternatively, if secured with a sleeve-like device 31A coupled to anchor 40, upon release of anchor 40, the end of antenna 30 pulls free of sleeve-like device 31A allowing antenna 30 to extend upward. The extended antenna 30 projects above magnetometer 10 as it floats on surface 11 at the end of a mission; see upper magnetometer 10 in FIG. 3. If magnetometer 10 was programmed for manual recovery, UHF transceiver 28 would not transmit data as it floats on surface 11, but antenna 30 may be extended to transmit a homing beacon or to otherwise aid in locating magnetometer 10.

Anchor 40 is made from essentially cone-shaped non-ferrous material having a sufficient weight to sink and hold magnetometer 10 on bottom 15. The weight of anchor 40 is sufficient to orient magnetometer 10 upright on bottom 15 and keep it firmly affixed to one location. Anchor 40 is connected to combination mechanical release mechanism 26 that may also have its own battery 27 and/or be coupled to power module 32. Release mechanism 26 can be incorporated into the body of anchor 40 or located in-between canister 16 and anchor 40 to releaseably connect anchor 40 to canister 16. In either case, release mechanism 26 is activated to release canister 16 from anchor 40. When released from the weight of anchor 40, canister 16 becomes positively buoyant and floats to surface 11. The activation of release mechanism 26 may be caused by a timed release relying on a dissolving link in combination release mechanism 26, an acoustically activated release activated by an acoustic command signal received by an acoustic transducer 48 from a remote data retrieval/control platform, and/or via an onboard solenoid operated release (or similar device) controlled by computer processor 24 and extending between canister 16 and anchor 40. Irrespective of which mode of release is relied upon, anchor 40 remains on bottom 15 and is separated from the upper cylindrically-shaped canister 16, and canister 16 and all components therein are buoyed upward to float on surface 11 for manual recovery and/or UHF transmission of data. The weight of batteries 34 in canister 16 ballasts magnetometer 10 to keep it in an upright position during ascent and while floating on surface 11 for reliable transmission of data and/or manual recovery.

Magnetometer 10 also has the capability to avoid the unintended recovery by others by selective scuttling. A pair of plugs 42 might be provided (one vent, one flood) on the bottom of electronics canister 16 that are uncovered upon release from anchor 40. If plugs 42 are timed dissolving plugs, the time needed to dissolve the material of plugs 42 in seawater gives magnetometer 10 a limited amount of time at the surface to transmit the gathered data before it self-scuttles. Optionally, plugs 42 could be made to be removed by incorporating small electrically activated valve-like devices that are activated via processor 24 after a predetermined period of time, or upon receipt of a scuttle command signal from a remote data retrieval/command platform to scuttle magnetometer 10.

Prior to a minesweeping operation, a sufficient number of preassembled magnetometers 10 are readied to record the sensed data representative of magnetic field strengths. The number and dispersion of magnetometers 10 are determined based on size of the operating area and the environment. Batteries 34 of magnetometers 10 can be charged and installed in canisters 16, or they can be charged via access port 35A of power module 35 after batteries 34 are placed in canister 16.

Magnetic switch 46 is activated to turn on magnetometers 10 except for each UHF transceiver 28 which is prevented from operation at this point by an interconnected transceiver switch 50 located adjacent to anchor 40. Each magnetometer 10 is enabled for gathering and recording data, and has its computer processor 24 programmed to commence recording magnetic strength data at a predetermined time to correspond with start of sweep operations. Magnetometers 10 are preferably launched from aircraft or surface craft and GPS position and time data are monitored and recorded by the launch platform. Placement of magnetometers by aircraft and/or surface vessels avoids the hazards that might be otherwise be created by such placement by personnel. During magnetic sweeping, each deployed magnetometer 10 records the local magnetic field strength output from the magnetic sweep system as it passes through the operating area. Upon completion of the mission, each magnetometer 10 surfaces after releasing its anchor 40 via release mechanism 26, as described above.

Transceiver switch 50 is held in the open position by anchor 40 when installed on canister 16. When anchor 40 is released from canister 16, transceiver switch 50 is allowed to close via, e.g., spring action, thereby connecting electrical power from batteries 34 to UHF transceiver 28 so it can transmit RF signals 29 from antenna 30 to transfer data and/or a homing beacon when canister 16 reaches surface 11.

At surface 11, each magnetometer 10 is either recovered manually by a surface vessel (less preferable due to need for human entry into operating area) or, as it floats, it transmits its data via onboard UHF transceiver 28 and antenna 30 to a receiving aircraft or surface vessel. Following a successful upload and transmission of gathered data from each UHF transceiver 28 and, if magnetometers 10 are not to be recovered, they can be programmed or commanded via a remotely originating radio command signal to each UHF transceiver 28 to scuttle via appropriate activation of electrically interconnected plugs 42.

Data recovered from one or more magnetometers 10 is then used by mission planners to determine if the predicted result matched the measured magnetic sweep performance. By knowing the sweep system parameters, sweep system tracks, and the location of each magnetometer 10, the actual performance of the sweep system can be determined.

Magnetometer 10 of the invention provides planners a better understanding of the effectiveness of magnetic minesweeping operations. Currently, there is no known ability to gauge magnetic sweep performance in an operational environment. Magnetometer 10 of the invention provides a relatively low cost, portable and expendable package that would eliminate the need to place and expose personnel in the field to make such determinations. Magnetometer 10 of the invention uses primarily commercial-off-the-shelf components so there are little non-recurring engineering costs and existing technology allows for the containment of hardware in packages small enough to be man portable for ease in handling and deployment. The use of combination anchor releases and radio transceiver as described herein eliminates the hazards normally associated with the need to place personnel in the field.

The disclosed components and their arrangements as disclosed herein all contribute to the novel features of this invention. Magnetometer 10 provides easily deployed, man portable means to record real-time magnetic field strengths to allow a determination of the effectiveness of minesweeping operations in various water environments. Therefore, magnetometer 10 of the invention, as disclosed herein, is not to be construed as limiting, but rather, is intended to be demonstrative of this inventive concept.

It should be readily understood that many modifications and variations of the present invention are possible within the purview of the claimed invention. It is to be understood that within the scope of the appended claims the invention may be practiced otherwise than as specifically described.

I claim:

1. An apparatus for recording magnetic field strengths in an area of the ocean comprising:
    an elongate canister having opposing upper and lower ends;
    a magnetometer sensor inside and at said upper end of said canister having sensitivity and resolution to detect magnetic field strengths of magnetic influence sweep systems and provide data signals representative of said detected magnetic field strengths;
    a computer processor in said canister being connected to said magnetometer sensor and programmed to control receipt and transmission of said detected magnetic field strength data signals;
    a memory device in said canister and coupled to said computer processor to store said detected magnetic field strength data signals;
    a power distribution system including at least one battery in said canister at said lower end of said canister and one or more electrical power distributing conductors coupled to said at least one battery and said magnetometer sensor, said computer processor and said memory device;
    a combination anchor release mechanism connected to the outside of said canister at said lower end; and
    an anchor releasably connected to said combination anchor release mechanism;
    an orientation sensor in said canister coupled to said computer processor, said memory device and said power distribution system and adapted to sense and provide data signals representative of the heading, pitch, and roll orientations of said magnetometer sensor;
    a temperature and depth sensor in said canister coupled to said computer processor, said memory device and said power distribution system and adapted to sense and provide data signals representative of temperature and depth of said magnetometer sensor; and
    a UHF transceiver inside and at said upper end of said canister having an antenna on the outside of said canister and coupled to said power distribution system and said computer processor to transmit and receive signals including collected data signals and remotely originating command signals.

2. The apparatus of claim 1 further comprising:
    a magnetically operated switch mounted on the inside of said canister and coupled to said power distribution system to electrically connect said at least one battery to said conductors, wherein said magnetically operated switch is capable of being activated by passing a small magnet over the external surface of said canister adjacent to the internal location of said magnetically operated switch.

3. The apparatus of claim 2 further comprising:
    means on said canister for holding said antenna in a folded position adjacent said canister, said means adapted to receive signals from said UHF transceiver and, in response thereto, to release said antenna from the folded position to an extended position.

4. The apparatus of claim 3 wherein said means for holding is a clamp.

5. The apparatus of claim 3 wherein said means for holding is a sleeve.

6. The apparatus of claim 1 further comprising a transceiver switch electrically coupled between said power distribution system and said UHF transceiver and mechanically coupled to said anchor and operable to activate upon release and movement of said anchor away from said canister.

* * * * *